(12) United States Patent
Audette et al.

(10) Patent No.: US 12,667,012 B2
(45) Date of Patent: Jun. 23, 2026

(54) CLUSTERING FINE PITCH MICRO-BUMPS FOR PACKAGING AND TEST

(71) Applicant: International Business Machines Corporation, Armonk, NY (US)

(72) Inventors: David Michael Audette, Colchester, VT (US); Grant Wagner, Jericho, VT (US); Steven Paul Ostrander, Poughkeepsie, NY (US); Hubert Harrer, Schoenaich (DE); Arvind Kumar, Chappaqua, NY (US); Thomas Anthony Wassick, LaGrangeville, NY (US); Matthew Sean Grady, Burlington, VT (US); Sungjun Chun, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 652 days.

(21) Appl. No.: 18/086,575

(22) Filed: Dec. 21, 2022

(65) Prior Publication Data

US 2024/0213217 A1 Jun. 27, 2024

(51) Int. Cl.
H05K 1/11 (2006.01)
H10W 70/60 (2026.01)
(Continued)

(52) U.S. Cl.
CPC ............. H10W 90/00 (2026.01); H05K 1/111 (2013.01); H10W 70/611 (2026.01);
(Continued)

(58) Field of Classification Search
CPC .. H05K 1/18–186; H05K 1/111; H05K 1/141; H05K 1/142; H05K 2201/09945;
(Continued)

(56) References Cited

U.S. PATENT DOCUMENTS

| | | | |
|---|---|---|---|
| 8,823,144 B2 | 9/2014 | Khan | |
| 10,026,680 B2 | 7/2018 | Shih | |

(Continued)

FOREIGN PATENT DOCUMENTS

| | | |
|---|---|---|
| CN | 113555350 A | 10/2021 |
| CN | 114725048 A | 7/2022 |

(Continued)

OTHER PUBLICATIONS

Lu, Y., Yin, W., Zhang, B., Yu, D., Wan, L., Shangguan, D., . . . & Xiao, F. (May 2013). A New 2.5 D TSV Package Assembly Approach. In 2013 IEEE 63rd Electronic Components and Technology Conference (pp. 1965-1969). IEEE. See highlighted sections.

(Continued)

*Primary Examiner* — Roshn K Varghese
(74) *Attorney, Agent, or Firm* — Harrity & Harrity, LLP

(57) ABSTRACT

An apparatus includes a chip package that has a chip connection surface and has an array of micro-bumps on the chip connection surface. The array of micro-bumps includes a plurality of subarrays of micro-bumps. Micro-bumps within each subarray are spaced apart by a chip pitch and the subarrays within the array are spaced apart by a card pitch that is an integer multiple of the chip pitch. The apparatus also includes a laminate circuit card that has a card connection surface that faces the chip connection surface of the chip package and that has an array of card pads adjacent to the card connection surface. The card pads are spaced apart by the card pitch, and each of the card pads is aligned to and electrically connected with a corresponding subarray of micro-bumps. In some embodiments, an interposer connects the card pads to the micro-bumps, and may include decoupling capacitors.

22 Claims, 7 Drawing Sheets

(51) Int. Cl.

| | | |
|---|---|---|
| *H10W 70/63* | (2026.01) | |
| *H10W 70/685* | (2026.01) | |
| *H10W 90/00* | (2026.01) | |
| *H10W 72/20* | (2026.01) | |

(52) U.S. Cl.
CPC ....... *H10W 70/635* (2026.01); *H10W 70/685* (2026.01); *H10W 90/401* (2026.01); *H10W 72/248* (2026.01); *H10W 90/724* (2026.01)

(58) Field of Classification Search
CPC .......... H05K 2201/10378; H05K 2201/09418; H05K 2201/10734; H01L 25/0655; H01L 25/50; H01L 23/5383; H01L 23/5384; H01L 23/5385; H01L 23/49816; H01L 23/49827; H01L 23/49838; H01L 24/14; H01L 24/16; H01L 2224/1412; H01L 2224/16227; H01L 2224/73204; H01L 2224/16225; H10W 90/00; H10W 70/611; H10W 70/635; H10W 70/685
See application file for complete search history.

(56) References Cited

U.S. PATENT DOCUMENTS

| | | | |
|---|---|---|---|
| 10,593,638 | B2 | 3/2020 | Gandhi |
| 11,024,601 | B2 | 6/2021 | Bohr |
| 11,037,883 | B2 | 6/2021 | Shtargot |
| 11,276,635 | B2 | 3/2022 | Sharan |
| 2010/0026368 | A1 | 2/2010 | Tang |
| 2011/0147913 | A1* | 6/2011 | Roberts ............. H01L 23/49811 |
| | | | 257/777 |
| 2013/0175686 | A1* | 7/2013 | Meyer ..................... H01L 24/17 |
| | | | 257/737 |
| 2015/0116965 | A1* | 4/2015 | Kim ................... H01L 23/5385 |
| | | | 361/767 |

| | | | |
|---|---|---|---|
| 2015/0348952 | A1 | 12/2015 | Refai-Ahmed |
| 2017/0068633 | A1 | 3/2017 | Kwon |
| 2018/0114770 | A1 | 4/2018 | Huang |
| 2019/0385995 | A1 | 12/2019 | Metras |
| 2020/0273809 | A1 | 8/2020 | Liu |
| 2020/0379013 | A1 | 12/2020 | Wang |
| 2021/0407966 | A1 | 12/2021 | Wu |
| 2022/0173064 | A1 | 6/2022 | Somma |

FOREIGN PATENT DOCUMENTS

| | | |
|---|---|---|
| TW | 201013887 | 4/2010 |
| TW | 201606971 | 2/2016 |
| TW | 201611220 | 3/2016 |
| TW | 201810570 | 3/2018 |
| TW | 202109686 | 3/2021 |
| TW | 202238751 | 10/2022 |
| TW | I847722 B | 7/2024 |

OTHER PUBLICATIONS

Marinissen, E. J., De Wachter, B., Smith, K., Kiesewetter, J., Taouil, M., & Hamdioui, S. (Oct. 2014). Direct Probing on Large-Array Fine-Pitch Micro-Bumps of a Wide-I/O Logic-Memory Interface. In 2014 International Test Conference (pp. 1-10). IEEE. See highlighted sections.
Suh, E. J., Riendeau, J., Popelar, S., & Measmer, R. (Jun. 2020). NEPP Studies on the Reliability of Flip Chip Solder Joints and 2.5 D Packaging. See highlighted sections.
Taiwan Intellectual Property Bureau, Ministry of Economic Affairs. Related patent Application 112119239, Examination report. Mar. 12, 2024. pp. 6 (In traditional Chinese but pp. 4 and 5 show a categories for cited references).
Taiwan Intellectual Property Bureau, Ministry of Economic Affairs. Related patent Application 112119239, Notice of Allowance. May 23, 2024. pp. 6.

* cited by examiner

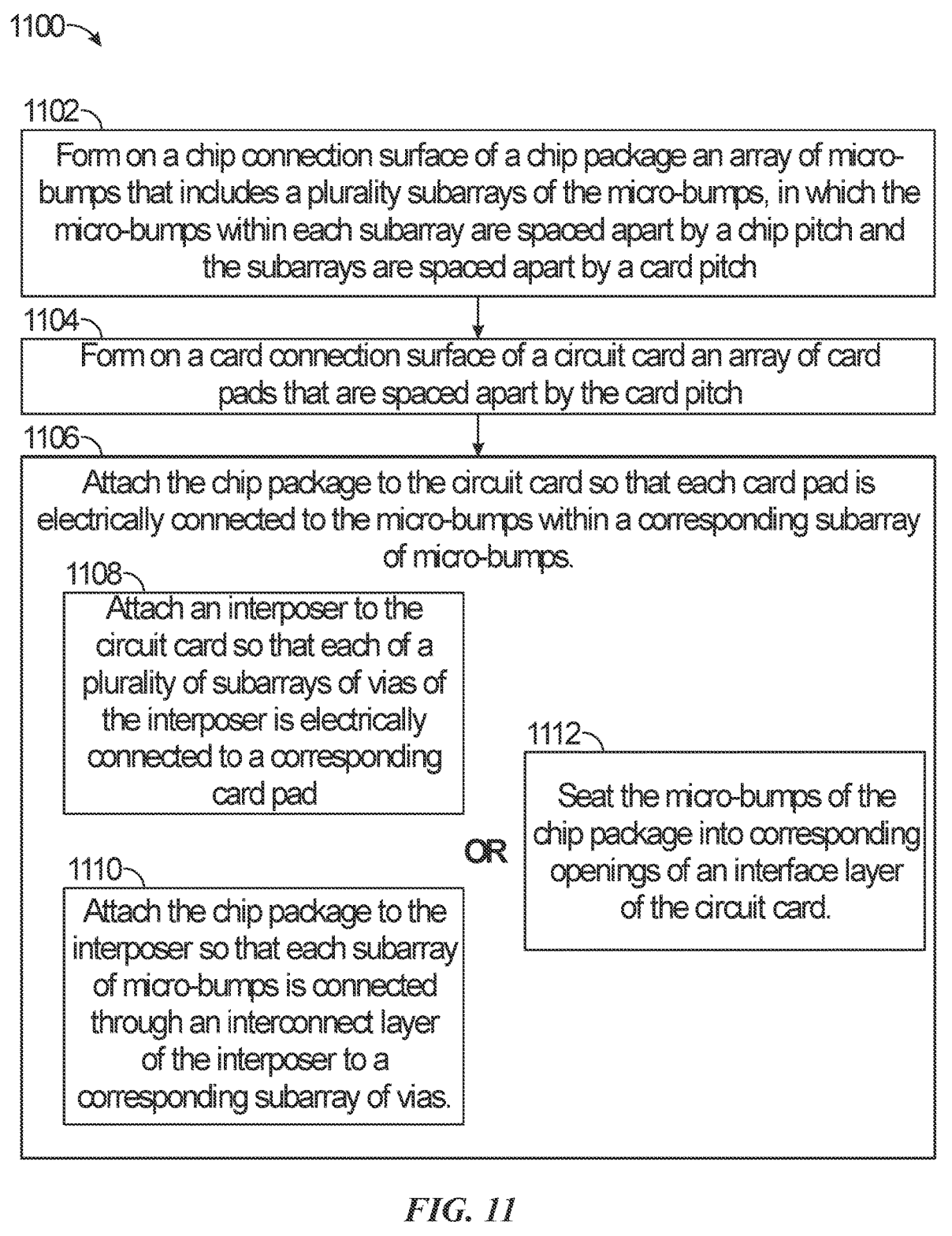

1100

1102

Form on a chip connection surface of a chip package an array of micro-bumps that includes a plurality subarrays of the micro-bumps, in which the micro-bumps within each subarray are spaced apart by a chip pitch and the subarrays are spaced apart by a card pitch

1104

Form on a card connection surface of a circuit card an array of card pads that are spaced apart by the card pitch

1106

Attach the chip package to the circuit card so that each card pad is electrically connected to the micro-bumps within a corresponding subarray of micro-bumps.

1108

Attach an interposer to the circuit card so that each of a plurality of subarrays of vias of the interposer is electrically connected to a corresponding card pad

1112

Seat the micro-bumps of the chip package into corresponding openings of an interface layer of the circuit card.

OR

1110

Attach the chip package to the interposer so that each subarray of micro-bumps is connected through an interconnect layer of the interposer to a corresponding subarray of vias.

*FIG. 11*

CLUSTERING FINE PITCH MICRO-BUMPS FOR PACKAGING AND TEST

BACKGROUND

The present invention relates to the electrical, electronic, and computer arts, and more specifically, to assembling integrated circuit chips onto laminate circuit boards.

High end processors require an increasing number of connections to their packages and the corresponding systems. Additionally, there is a demand for more silicon area within a package, which is driving efforts to join multiple processors and support devices together in one package. To be efficient, the processors need wide bandwidth to communicate with each other. Joining devices with high speed/bandwidth can take several different approaches.

One technology is 2.5D, which utilizes a silicon interposer to connect multiple processors and support devices with wide bandwidth by using a fine micro-bump pitch (100 μm or less) for communication. However, conventional laminate technology is not capable of reaching 50 μm (micrometer) pitch. Since high speed/bandwidth communication between devices requires fine pitch, this is easily connected and wired through a silicon interposer and not though the laminate. Other sections of the processor and support devices may not require high speed/bandwidth and fine pitch, but in some cases, are forced to utilize the same micro-bump structure. This presents a packaging, design, and test challenge. For example, standard wafer test probes are fabricated at a larger pitch than the pitch of the micro-bump structure. It would be challenging to fabricate the test probes at the small pitch of the micro-bump structure.

SUMMARY

Principles of the invention provide techniques for clustered fine pitch micro-bumps.

According to one aspect, an exemplary apparatus includes a chip package that has a chip connection surface and has an array of micro-bumps on the chip connection surface. The array of micro-bumps includes a plurality of subarrays of micro-bumps. Micro-bumps within each subarray are spaced apart by a chip pitch and the subarrays within the array are spaced apart by a card pitch that is an integer multiple of the chip pitch. The exemplary apparatus also includes a laminate circuit card that has a card connection surface that faces the chip connection surface of the chip package and that has an array of card pads adjacent to the card connection surface. The card pads are spaced apart by the card pitch, and each of the card pads is aligned to and electrically connected with a corresponding subarray of micro-bumps.

According to another aspect, an exemplary apparatus includes a chip package that has a chip connection surface and has an array of micro-bumps on the chip connection surface. The array of micro-bumps includes a plurality of subarrays of micro-bumps, and micro-bumps within each subarray are spaced apart by a chip pitch and the subarrays within the array are spaced apart by a card pitch that is an integer multiple of the chip pitch. The apparatus also includes an interposer that is disposed adjacent to the chip connection surface of the chip package. The interposer includes a first surface that is adjacent to the chip connection surface; an interconnect layer that is adjacent to the first surface and electrically connected to the micro-bumps; a second surface that is opposite the first surface; and an array of vias that extend from the interconnect layer to the second surface and are arranged in a plurality of subarrays, so that each subarray of vias are electrically connected by the interconnect layer to a corresponding subarray of micro-bumps.

According to another aspect, an exemplary method for connecting a chip package to a large pitch circuit card includes forming on a chip connection surface of the chip package an array of micro-bumps that includes a plurality of subarrays of the micro-bumps. The micro-bumps within each subarray are spaced apart by a chip pitch and the subarrays are spaced apart by a card pitch. The method also includes forming on a card connection surface of the circuit card an array of card pads that are spaced apart by the card pitch; and attaching the chip package to the circuit card so that each card pad is electrically connected to the micro-bumps within a corresponding subarray of micro-bumps.

According to another aspect, an exemplary apparatus includes a chip package that has a chip connection surface and has an array of micro-bumps on the chip connection surface. The array of micro-bumps includes a plurality of subarrays of micro-bumps, and micro-bumps within each subarray are spaced apart by a chip pitch and the subarrays within the array are spaced apart by a card pitch that is an integer multiple of the chip pitch. The apparatus also includes a laminate circuit card that has a card connection surface that faces the chip connection surface of the chip package and that has an array of card pads adjacent to the card connection surface, wherein the card pads are spaced apart by the card pitch. Additionally, the apparatus includes means for electrically connecting each of the card pads to a corresponding subarray of micro-bumps (such means could include, for example, an interposer or an interface layer).

According to another aspect, an exemplary apparatus includes an interposer body that has a chip connection surface and a card connection surface that is opposite the chip connection surface; a plurality of vias that penetrate the interposer body and that electrically connect the chip connection surface to the card connection surface; a first plurality of capacitor leaves that extend from a first one of the vias; and a second plurality of capacitor leaves that extend from a second one of the vias. The first and second vias are adjacent to each other and the first and second pluralities of capacitor leaves are interleaved within the interposer body.

In view of the foregoing, techniques of the present invention can provide substantial beneficial technical effects. For example:

By clustering building blocks of power, ground, and slow speed signal micro-bumps at a pitch that is an integer multiple of the chip package pitch, they can be designed to operate inside the fab (fabrication) limitations of package and probe laminates.

Thus, a fine pitch chip package can be connected to a standard laminate technology.

Clustering micro-bumps on the chip package simplifies the design for connecting to the laminate (straight through for each cluster).

Clustering micro-bumps on the chip package allows use of current processor power delivery architecture.

Clustering micro-bumps on the chip package also allows utilization of a wafer test probe at the current standard pitch (for example, a 150 μm probe pitch with each probe touching a 3×3 orthogonal array of micro-bumps at 50 μm pitch).

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 11 depicts, in a flowchart, steps of a method for assembling a chip to a package, where the chip and the package have different connector pitches, according to exemplary embodiments.

DETAILED DESCRIPTION

Figure 1:
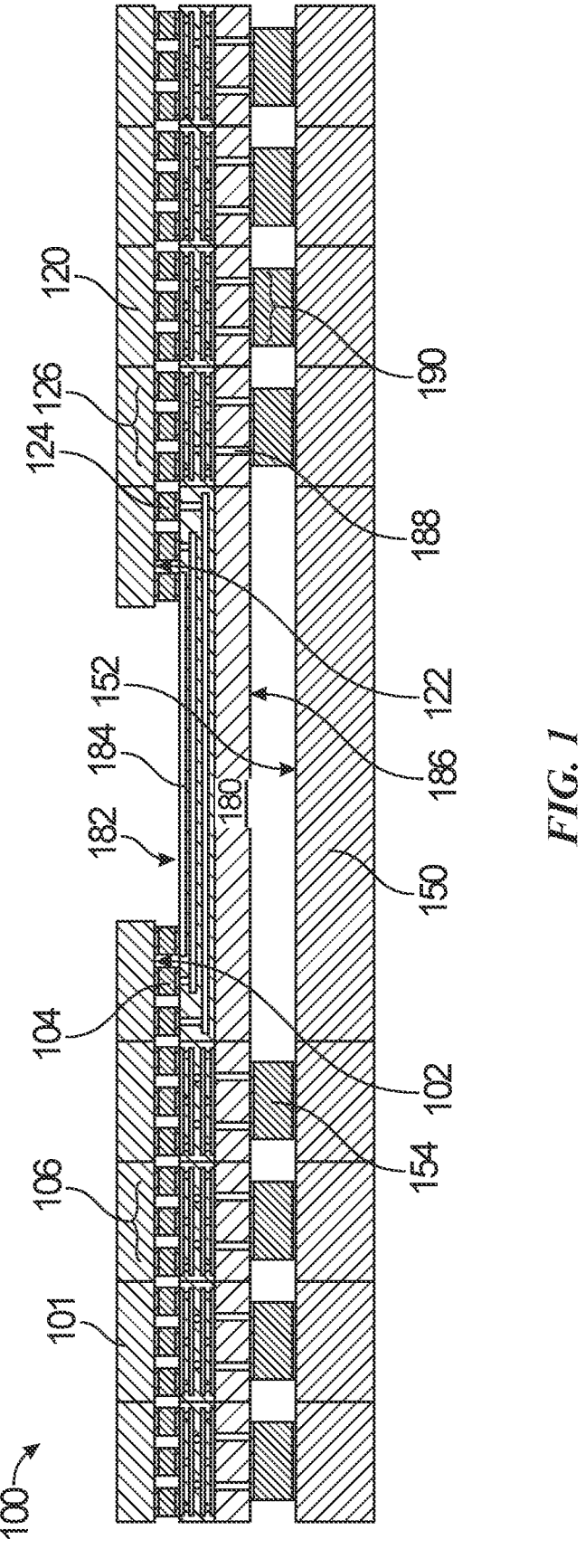
FIG. 1 depicts, in a schematic, an assembly of two chip packages, a circuit card, and an interposer, according to exemplary embodiments.

FIG. 1 depicts, in a schematic, an assembly 100 of two chip packages 101 and 120, a circuit card 150, and an interposer 180, according to exemplary embodiments. The chip package 101 has a chip connection surface 102 and has an array of fine pitch (e.g., on the order of 50 μm (microns) micro-bumps 104 on the chip connection surface. The array of micro-bumps includes a plurality of subarrays 106 of micro-bumps. Micro-bumps within each subarray are spaced apart by a chip pitch and the subarrays within the array are spaced apart by a card pitch that is an integer multiple of the chip pitch. Similarly, the chip package 120 has a second chip connection surface 122 with a second array of micro-bumps 124 that includes a second plurality of subarrays 126 of micro-bumps. In one or more embodiments, the chip pitch is 50 μm and the card pitch is 150 μm.

The laminate circuit card 150 has a card connection surface 152 that faces the chip connection surface of the chip package and that has an array of card pads 154 adjacent to the card connection surface. The card pads are spaced apart by the card pitch, and each of the card pads is aligned to and electrically connected with a corresponding subarray of micro-bumps. In one or more embodiments, the card pads are arranged in an orthogonal array. In other embodiments, the card pads are arranged in a hexagonal array, but could also be arranged in other configurations (e.g., arrangements 604, 608 in FIG. 6).

Figure 4:
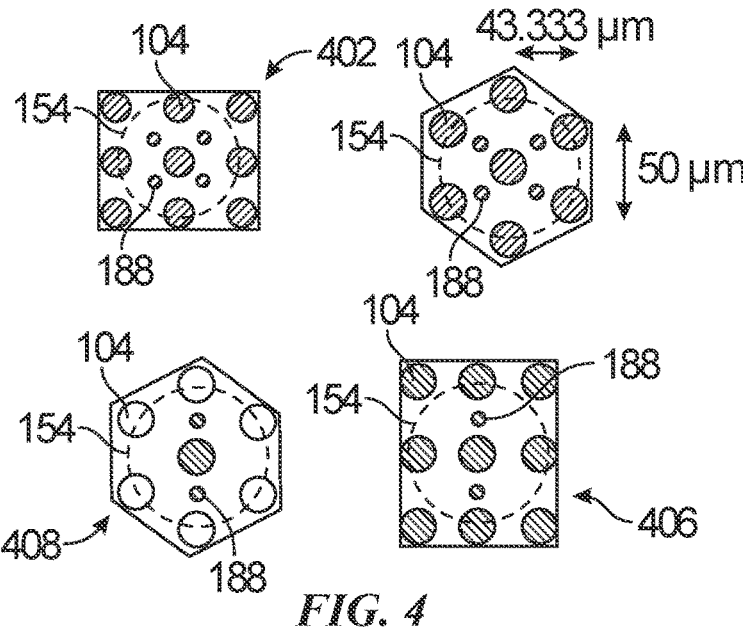
FIG. 4 depicts, in schematics, various arrangements of micro-bumps, vias, and card pads that could be used in the detail of FIG. 3.

The interposer 180 includes a first surface 182 that is adjacent to the chip connection surface; an interconnect layer 184 that is adjacent to the first surface and electrically connected to the micro-bumps; a second surface 186 that is opposite the first surface and adjacent to the circuit card; and an array of vias 188 that extend from the interconnect layer to the second surface and are arranged in a plurality of subarrays 190. Each subarray of vias is electrically connected by the interconnect layer to a corresponding subarray of micro-bumps and is electrically connected at the second surface to a corresponding card pad. In one or more embodiments, the interconnect layer is arranged to symmetrically distribute electrical current from each subarray of micro-bumps to the corresponding subarray of vias. In one or more embodiments, each subarray of vias is arranged to symmetrically distribute current from the interconnect layer to the corresponding card pad. FIG. 4 shows details of the via arrangements.

In one or more embodiments, the interconnect layer 184 of the interposer also electrically connects selected subarrays of micro-bumps on the chip package to corresponding subarrays of micro-bumps on the second chip package.

Figure 2:
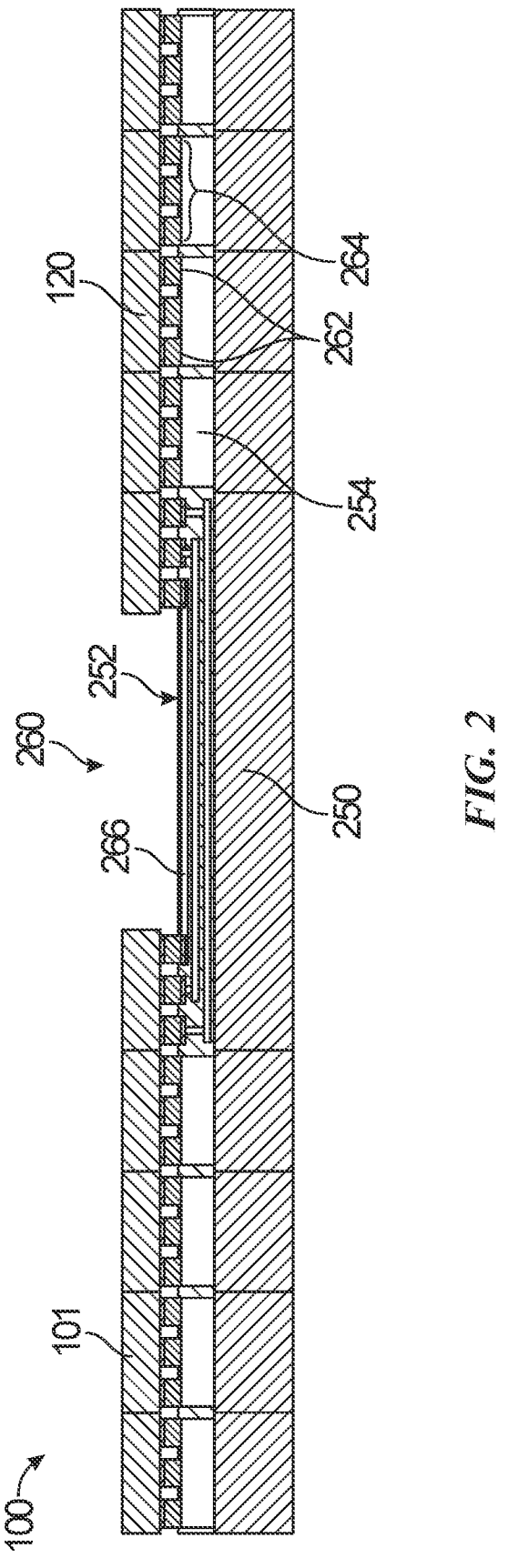
FIG. 2 depicts, in a schematic, an assembly of two chip packages and a circuit card that has an interface layer, according to exemplary embodiments.

FIG. 2 depicts, in a schematic, an assembly 200 of two chip packages 101, 120 and a circuit card 250. The chip packages 101, 120 are the same as described with reference to FIG. 1. The circuit card 250 has an interface layer 260 at its card connection surface 252. In one or more embodiments, the interface layer includes a thin film; in other embodiments, the interface layer includes a solder mask. The interface layer defines openings 262 that are spaced at the chip pitch. Each opening corresponds to a micro-bump on the chip connection surface of a chip package, and subarrays 264 of the openings correspond to card pads 254 that underlie the interface layer. In one or more embodiments, the interface layer also includes chip interconnect traces 266 that electrically connect micro-bumps of the chip 101 to micro-bumps of the chip 120 in a high-speed/high-bandwidth signal pathway.

Thus, either the interposer that is shown in FIG. 1, or the interface layer that is shown in FIG. 2, can be used to electrically connect each of the card pads to a corresponding subarray of micro-bumps. Given the teachings herein, additional techniques to electrically connect each of the card pads to a corresponding subarray of micro-bumps will be apparent to the skilled artisan.

Figure 3:
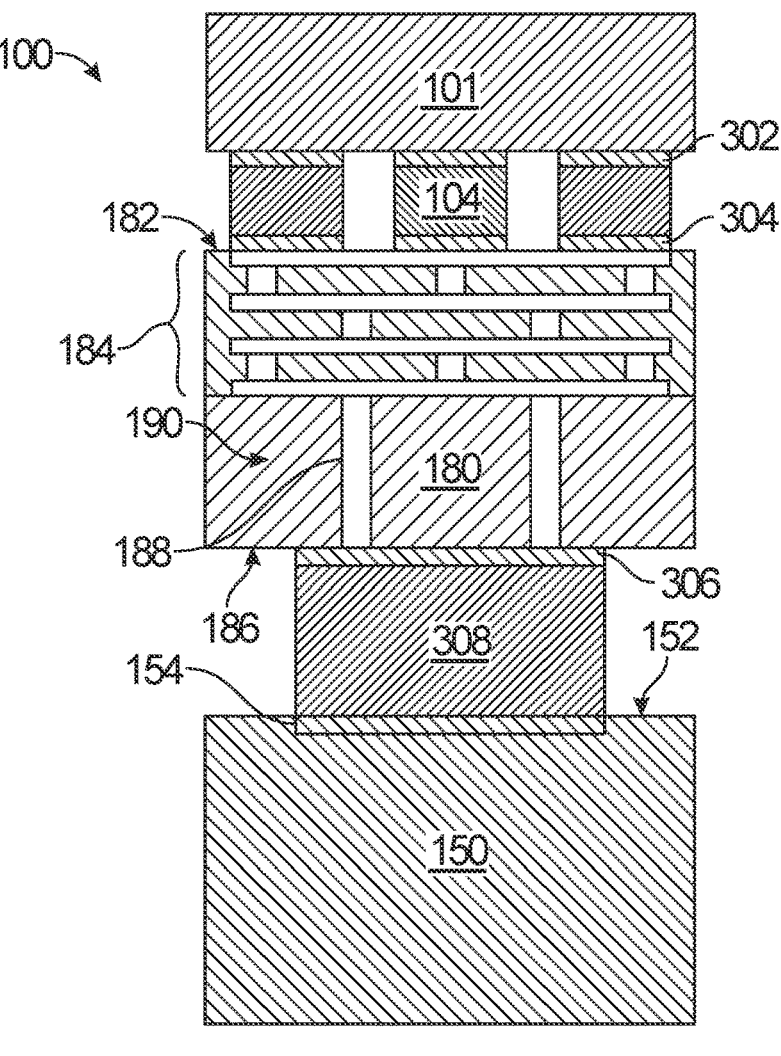
FIG. 3 depicts, in a schematic, a detail of the assembly that is shown in FIG. 1.

FIG. 3 depicts, in a schematic, a detail of the assembly 100 that is shown in FIG. 1. The micro-bumps 104 connect chip pads 302 of the chip package 101 to upper pads 304 of the interposer 180. The interconnect layer 184 connects the upper pads 304 to the vias 188. The vias 188 connect to lower pads 306 of the interposer 180, which are in turn connected to the card pads 154 by solder balls 308. In other embodiments, direct bond interconnects can be used instead of the solder balls. For example, thermal compression bonding could be used.

FIG. 4 depicts, in schematics, various arrangements of micro-bumps 104, vias 188, and card pads 154 that can be used in the detail of FIG. 3. In an arrangement 402, there is an orthogonal pattern of nine micro-bumps 104 that are connected through the interconnect layer (not shown) with an orthogonal pattern of four vias 188, which in turn are connected to a card pad 154. In an arrangement 404, there is a hexagonal pattern of seven micro-bumps 104 that are connected through the interconnect layer (not shown) with an orthogonal pattern of four vias 188, which in turn are connected to a card pad 154. In an arrangement 406, there is an orthogonal pattern of nine micro-bumps 104 that are connected through the interconnect layer (not shown) with two vias 188, which in turn are connected to a card pad 154. In an arrangement 408, there is a hexagonal pattern of seven micro-bumps 104 that are connected through the interconnect layer (not shown) with two vias 188, which in turn are connected to a card pad 154. In one or more embodiments, the vias are arranged for even distribution of current flow from the pad to the microbumps; e.g., the vias can be in a symmetric pattern with reference to the micro-bumps.

Figure 5:
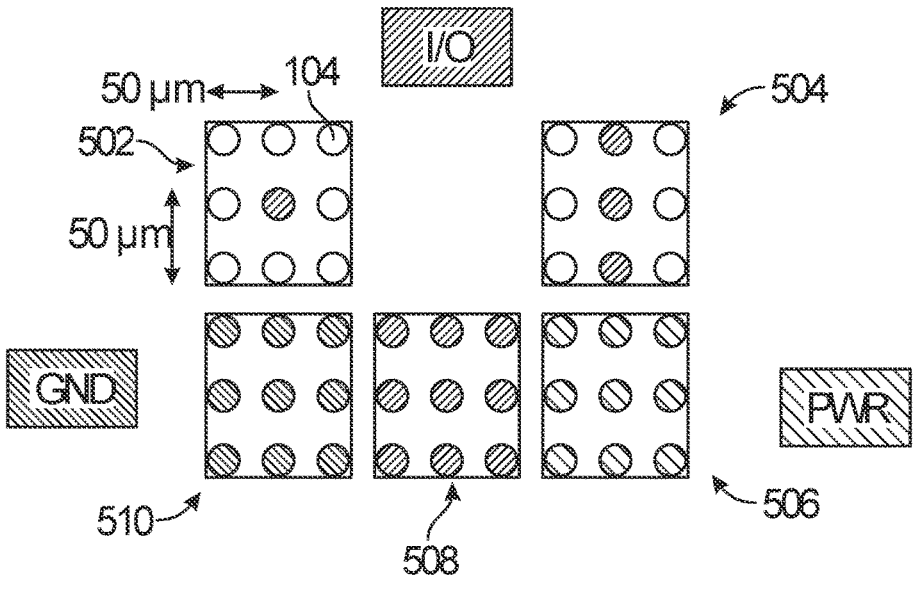
FIG. 5 depicts, in schematics, orthogonal subarrays of micro-bumps on a chip package, according to exemplary embodiments.

FIG. 5 depicts, in schematics, orthogonal subarrays of micro-bumps 104 on a chip package, according to exemplary embodiments. In subarray 502, only a central micro-bump is connected to the chip package data signal I/O. In subarray 504, three of the micro-bumps are connected to the I/O. In subarray 506, all nine of the micro-bumps are connected to the chip package power bus PWR. In subarray 508, all nine of the micro-bumps are connected to the I/O. In subarray 510, all nine of the micro-bumps are connected to the chip package ground bus GND.

Figure 6:
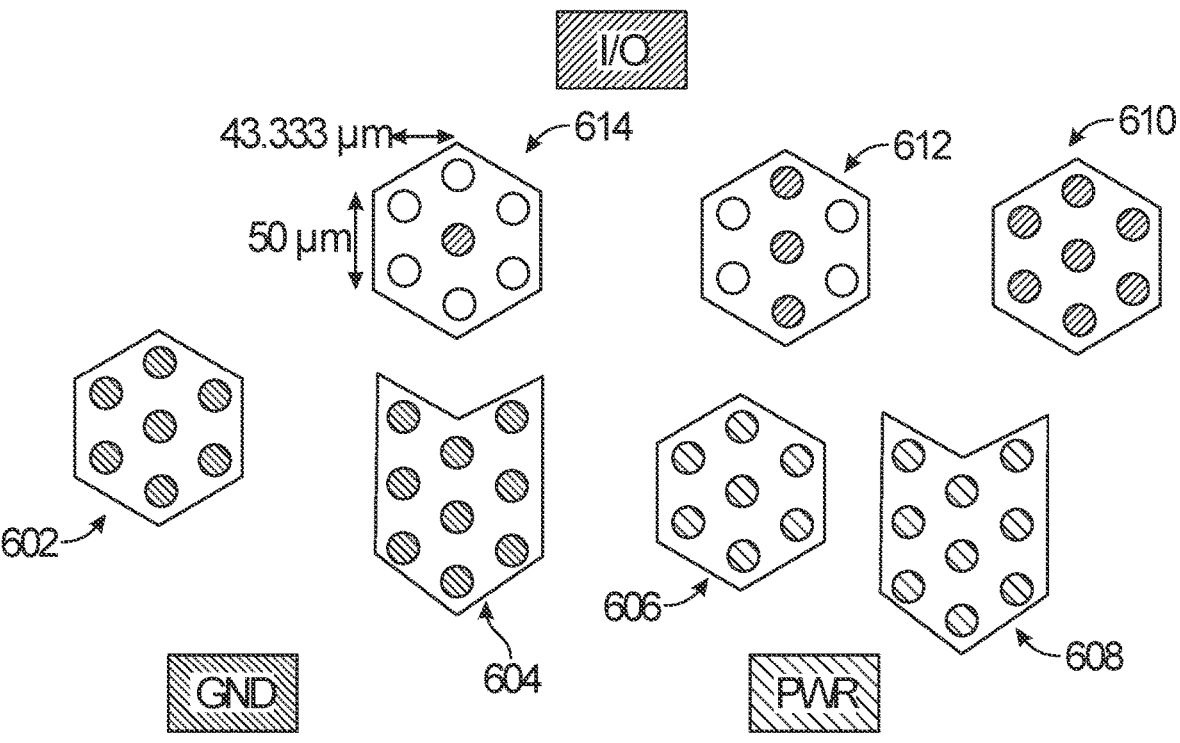
FIG. 6 depicts, in schematics, hexagonal subarrays of micro-bumps on a chip package, according to exemplary embodiments.

FIG. 6 depicts, in schematics, hexagonal subarrays of micro-bumps on a chip package, according to exemplary embodiments. In subarray 602, all seven micro-bumps are connected to the ground bus GND. In subarray 604, all nine of the micro-bumps are connected to GND. In subarray 606, all seven micro-bumps are connected to the power bus PWR. In subarray 608, all nine of the micro-bumps are connected to PWR. In subarray 610, all seven micro-bumps are connected to the signal bus I/O. In subarray 612, three of the seven micro-bumps are connected to the I/O. In subarray 614, only a central micro-bump is connected to the I/O.

Figure 7:
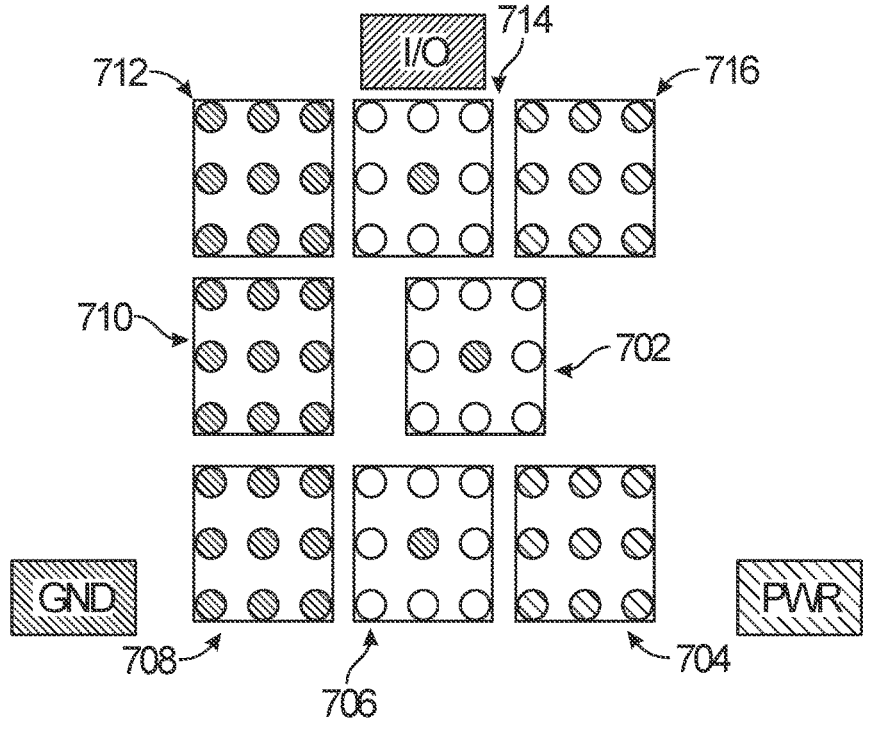
FIG. 7 depicts, in a schematic, an offset subarray of micro-bumps on a chip package, according to exemplary embodiments.

FIG. 7 depicts, in a schematic, an offset subarray 702 of micro-bumps on a chip package, according to exemplary embodiments. The subarray 702 is set aside from a usual pattern of micro-bumps formed by the other subarrays 704, 706, 708, 710, 712, 714, 716. This can be done, for example, by omitting certain micro-bumps, in order to contact a single signal in any position in a cluster.

Figure 8:
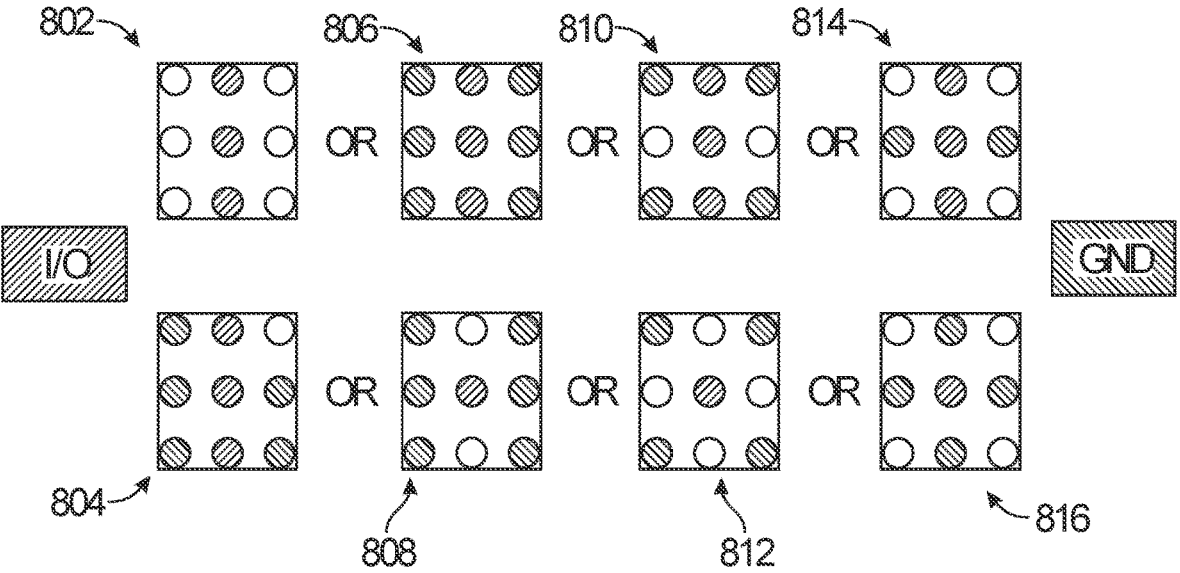
FIG. 8 depicts, in schematics, a plurality of configurations of subarrays of micro-bumps on a chip package, according to exemplary embodiments.

FIG. 8 depicts, in schematics, a plurality of configurations of subarrays of micro-bumps on a chip package, according to exemplary embodiments. In subarray 802, three micro-bumps are connected to the I/O. In subarray 804, only a central micro-bump is connected to the I/O. In subarray 806, three micro-bumps are connected to the I/O and six are connected to GND. In subarray 808, only a central micro-bump is connected to I/O and eight peripheral micro-bumps are connected to GND. In subarray 810, three micro-bumps are connected to the I/O and four corner micro-bumps are connected to GND. In subarray 812, only a central micro-bump is connected to the I/O and four corner micro-bumps are connected to GND. In subarray 814, three micro-bumps are connected to the I/O and two edge micro-bumps are connected to GND. In subarray 816, only a central micro-bump is connected to the I/O and four edge micro-bumps are connected to GND.

Figure 9:
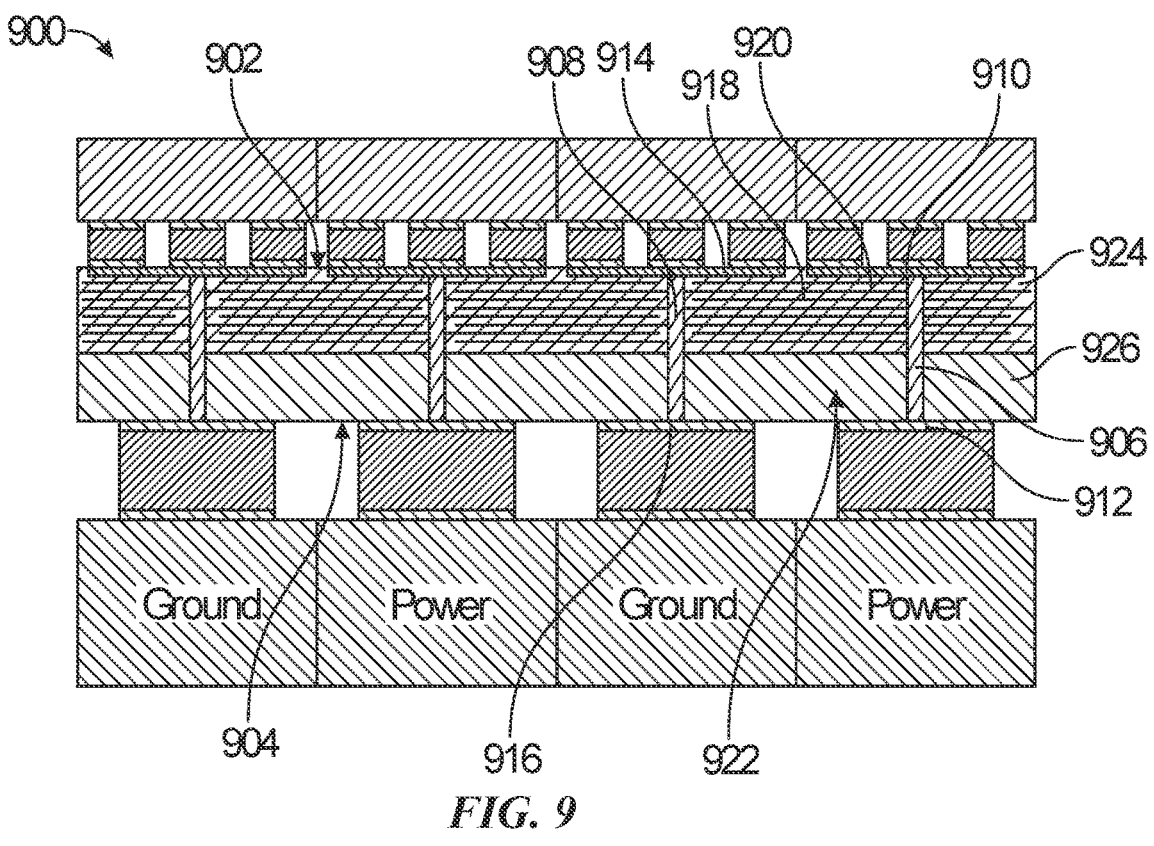
FIG. 9 depicts, in a schematic, an interposer that includes a horizontal interleaved configuration of vias and capacitor leaves, according to exemplary embodiments.

FIG. 9 depicts, in a schematic, an interposer body 900 has a chip connection surface 902 and a card connection surface 904 that is opposite the chip connection surface. Vias 906, 908 penetrate the interposer body and electrically connect the chip connection surface to the card connection surface. In one or more embodiments, each of the vias 906 is connected between a chip PWR pad 910 on the chip connection surface and a card PWR pad 912 at the card connection surface, while each of the vias 908 is connected between a chip GND pad 914 on the chip connection surface and a card GND pad 916 on the card connection surface. First pluralities of capacitor leaves 918 extend outward from each of the vias 906, and second pluralities of capacitor leaves 920 extend outward from each of the vias 908. The capacitor leaves 918, 920 are generally parallel to the surfaces 902, 904 and they are interleaved within the interposer body. Thus, the capacitor leaves 918, 920 form decoupling capacitors 922 that mitigate electrical losses that could otherwise be caused by rapid fluctuations of current. In one or more embodiments, the decoupling capacitors 922 are formed within a built up insulator layer 924, which is distinct from and formed after a substrate 926 of the interposer body 900. FIG. 9 is not necessarily to scale: the insulator layer 924 is typically on the order of tens of micrometers in thickness, whereas the substrate 926 is typically on the order of hundreds of micrometers in thickness.

Figure 10:
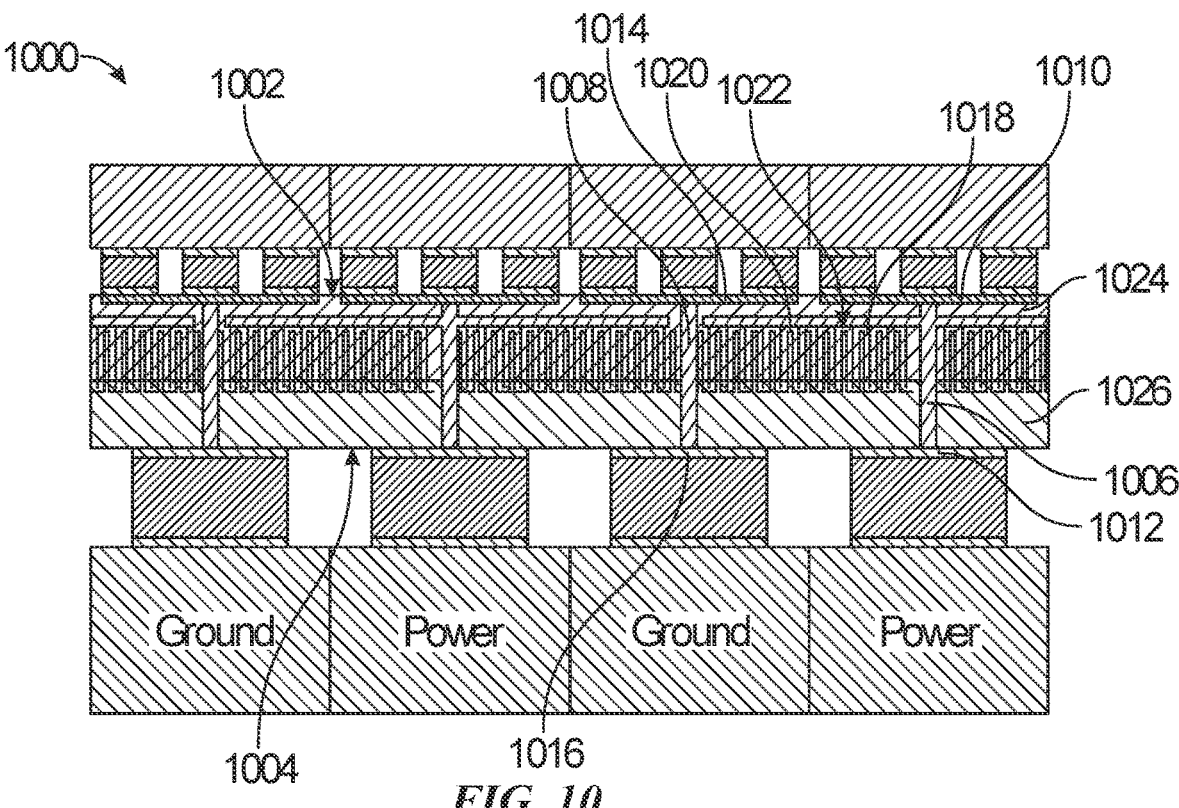
FIG. 10 depicts, in a schematic, an interposer that includes a deep trench interleaved configuration of vias and capacitor leaves, according to exemplary embodiments.

FIG. 10 depicts, in a schematic, an interposer body 1000 that has a chip connection surface 1002 and a card connection surface 1004. Within the interposer body 1000 is a deep trench interleaved configuration of vias 1006, 1008 and capacitor leaves 1018, 1020. As in FIG. 9, the vias 1006 connect PWR pads 1010 to PWR pads 1012, while the vias 1008 connect GND pads 1014 to GND pads 1016. By contrast to FIG. 9, in the interposer body 1000 the capacitor leaves 1018, 1020 are generally comb-shaped and have portions that extend perpendicular to the surfaces 1002, 1004. As in FIG. 9, the capacitor leaves 1018, 1020 form decoupling capacitors 1022 that mitigate electrical losses that could otherwise be caused by rapid fluctuations of current. In one or more embodiments, the decoupling capacitors 1022 are formed partly within a built up insulator layer 1024, which is distinct from and formed after a substrate 1026 of the interposer body 1000. In one or more embodiments, in fabricating the decoupling capacitors 1022, the leaves 1020 are formed on walls of trenches that are etched or drilled down into the bulk silicon 1026 and then the metal-insulator-metal (MIM) structure is built up from there. FIG. 10 is not necessarily to scale: the insulator layer 1024 is typically on the order of tens of micrometers in thickness, whereas the substrate 1026 is typically on the order of hundreds of micrometers in thickness.

In FIG. 9 or FIG. 10, providing the decoupling capacitors 922, 1022 within the interposer body 900 or 1000 advantageously reduces inductive losses between the chips and the capacitors, while mitigating the problem that capacitors do not economically scale to process nodes. Thus, putting the capacitors in the interposer body frees up valuable chip space for computational or memory components, but keeps the capacitors close to the chip so that they are more effective than they would be if they were disposed on the card.

Given the discussion thus far, it will be appreciated that, in general terms, an exemplary apparatus 100 or 200, according to an aspect of the invention, includes a chip package 101 that has a chip connection surface 102 and has an array of micro-bumps 104 on the chip connection surface. The array of micro-bumps includes a plurality of subarrays 106 of micro-bumps. Micro-bumps within each subarray are spaced apart by a chip pitch and the subarrays within the array are spaced apart by a card pitch that is an integer multiple of the chip pitch. The exemplary apparatus also includes a laminate circuit card 150 or 250 that has a card connection surface 152 or 252 that faces the chip connection surface of the chip package and that has an array of card pads 154 or 254 adjacent to the card connection surface. The card pads are spaced apart by the card pitch, and each of the card pads is aligned to and electrically connected with a corresponding subarray of micro-bumps.

In one or more embodiments, the apparatus also includes an interposer 180 that is disposed between the chip package and the circuit card. The interposer includes: a first surface 182 that is adjacent to the chip connection surface; an interconnect layer 184 that is adjacent to the first surface and electrically connected to the micro-bumps; a second surface 186 that is opposite the first surface and adjacent to the circuit card; and an array of vias 188 that extend from the interconnect layer to the second surface and are arranged in a plurality of subarrays 190, so that each subarray of vias is electrically connected by the interconnect layer to a corresponding subarray of micro-bumps and is electrically connected at the second surface to a corresponding card pad.

In one or more embodiments, the interconnect layer is arranged to evenly distribute electrical current from each subarray of micro-bumps to the corresponding subarray of vias.

In one or more embodiments, each subarray of vias is arranged to evenly distribute current from the interconnect layer to the corresponding card pad.

In one or more embodiments, the apparatus also includes a second chip package 120 that has a second chip connection surface 122 with a second array of micro-bumps 124 that includes a second plurality of subarrays 126 of micro-bumps, and the interconnect layer of the interposer electrically connects selected micro-bumps on the chip package to corresponding micro-bumps on the second chip package.

In one or more embodiments, the circuit card includes an interface layer 260 at the card connection surface. The interface layer includes openings 262 that are spaced at the chip pitch, each opening corresponds to a micro-bump on the chip connection surface of the chip package, and subarrays 264 of the openings correspond to card pads.

In one or more embodiments, the apparatus also includes a second chip package 120 that has a second chip connection surface with a second array of micro-bumps that includes a second plurality of subarrays of micro-bumps, and the interface layer includes chip-to-chip connection traces 266 that electrically connect selected micro-bumps on the chip package to corresponding micro-bumps on the second chip package.

In one or more embodiments, the micro-bumps are arranged in orthogonal subarrays. In one or more embodiments, there are nine positions in each subarray and at least a central position in a subarray has a micro-bump that is connected to a data signal pathway of the chip package. In one or more embodiments, the card pads are arranged in an orthogonal array.

In one or more embodiments, the micro-bumps are arranged in hexagonal subarrays. In one or more embodiments, there are seven positions in each subarray and at least a central position in a subarray has a micro-bump that is connected to a data signal pathway of the chip package. In one or more embodiments, the card pads are arranged in a hexagonal array.

According to another aspect, an exemplary apparatus includes a chip package 101 that has a chip connection surface 102 and has an array of micro-bumps 104 on the chip connection surface. The array of micro-bumps includes a plurality of subarrays 106 of micro-bumps, and micro-bumps within each subarray are spaced apart by a chip pitch and the subarrays within the array are spaced apart by a card pitch that is an integer multiple of the chip pitch. The apparatus also includes an interposer 180 that is disposed adjacent to the chip connection surface of the chip package.

The interposer includes a first surface 182 that is adjacent to the chip connection surface; an interconnect layer 184 that is adjacent to the first surface and electrically connected to the micro-bumps; a second surface 186 that is opposite the first surface; and an array of vias 188 that extend from the interconnect layer to the second surface and are arranged in a plurality of subarrays 190, so that each subarray of vias are electrically connected by the interconnect layer to a corresponding subarray of micro-bumps.

In one or more embodiments, each subarray of vias has fewer vias than a corresponding number of micro-bumps in the corresponding subarray of micro-bumps.

In one or more embodiments, the interconnect layer is arranged to evenly distribute electrical current from each subarray of micro-bumps to the corresponding subarray of vias.

In one or more embodiments, each subarray of vias has approximately the same total cross-sectional area as the corresponding subarray of micro-bumps.

According to another aspect, as shown in FIG. 11, an exemplary method 1100 for connecting a chip package to a large pitch circuit card includes, at 1102, forming on a chip connection surface of the chip package an array of micro-bumps that includes a plurality of subarrays of the micro-bumps. The micro-bumps within each subarray are spaced apart by a chip pitch and the subarrays are spaced apart by a card pitch. The method also includes, at 1104, forming on a card connection surface of the circuit card an array of card pads that are spaced apart by the card pitch; and, at 1106, attaching the chip package to the circuit card so that each card pad is electrically connected to the micro-bumps within a corresponding subarray of micro-bumps.

In one or more embodiments, attaching the chip package to the circuit card includes, in any order: at 1108, attaching an interposer to the circuit card so that each of a plurality of subarrays of vias of the interposer is electrically connected to a corresponding card pad; and at 1110, attaching the chip package to the interposer so that each subarray of micro-bumps is connected through an interconnect layer of the interposer to a corresponding subarray of vias.

In one or more embodiments, attaching the chip package to the circuit card includes, at 1112, seating the micro-bumps of the chip package into corresponding openings of an interface layer of the circuit card.

According to another aspect, an exemplary apparatus 100 or 200 includes a chip package 101 that has a chip connection surface 102 and has an array of micro-bumps 104 on the chip connection surface. The array of micro-bumps includes a plurality of subarrays 106 of micro-bumps, and micro-bumps within each subarray are spaced apart by a chip pitch and the subarrays within the array are spaced apart by a card pitch that is an integer multiple of the chip pitch. The apparatus also includes a laminate circuit card 150 or 250 that has a card connection surface 152 or 252 that faces the chip connection surface of the chip package and that has an array of card pads 154 or 254 adjacent to the card connection surface, wherein the card pads are spaced apart by the card pitch. Additionally, the apparatus includes means for electrically connecting each of the card pads to a corresponding subarray of micro-bumps. Such means could include, for example, an interposer 180 as discussed with reference to FIG. 1 and FIG. 3, or an interface layer 260 as discussed with reference to FIG. 2.

In one or more embodiments, each of the card pads is aligned to and electrically connected with all of the micro-bumps of the corresponding subarray of micro-bumps.

According to another aspect, an exemplary apparatus 900 or 1000 includes an interposer body that has a chip connection surface 902 or 1002 and a card connection surface 904 or 1004 that is opposite the chip connection surface; a plurality of vias 906 or 1006 that penetrate the interposer body and that electrically connect the chip connection surface to the card connection surface; a first plurality of capacitor leaves 918 or 1018 that extend from a first one of the vias; and a second plurality of capacitor leaves 920 or 1020 that extend from a second one of the vias. The first and second vias are adjacent to each other and the first and second pluralities of capacitor leaves are interleaved within the interposer body.

In one or more embodiments, the capacitor leaves 918, 920 are generally planar in shape and extend through the interposer body parallel to the chip connection surface and the card connection surface.

In one or more embodiments, the capacitor leaves 1018, 1020 are comb-shaped and have interleaved teeth that extend perpendicular to the chip connection surface and the card connection surface.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   a chip package that has a chip connection surface and has an array of micro-bumps on the chip connection surface, wherein the array of micro-bumps comprises a pattern of a plurality of subarrays of micro-bumps, wherein each subarray includes a cluster of power micro-bumps, a cluster of ground micro-bumps, or a cluster of signal micro-bumps, wherein the micro-bumps within each subarray are spaced apart by a chip pitch and the subarrays within the pattern are spaced apart by a card pitch that is an integer multiple of the chip pitch; and
   a laminate circuit card that has a card connection surface that faces the chip connection surface of the chip package and that has an array of card pads adjacent to the card connection surface, wherein the card pads are spaced apart by the card pitch, and each of the card pads is aligned to and electrically connected with a corresponding subarray of micro-bumps.

2. The apparatus of claim 1, further comprising an interposer that is disposed between the chip package and the laminate circuit card, wherein the interposer comprises:
   a first surface that is adjacent to the chip connection surface;
   an interconnect layer that is adjacent to the first surface and electrically connected to the micro-bumps;
   a second surface that is opposite the first surface and adjacent to the laminate circuit card; and
   an array of vias that extend from the interconnect layer to the second surface and are arranged in a plurality of subarrays, wherein each subarray of vias is electrically connected by the interconnect layer to a corresponding subarray of micro-bumps and is electrically connected at the second surface to a corresponding card pad.

3. The apparatus of claim 2, wherein the interconnect layer is arranged to evenly distribute electrical current from each subarray of micro-bumps to the corresponding subarray of vias.

4. The apparatus of claim 2, wherein each subarray of vias is arranged to evenly distribute electrical current from the interconnect layer to the corresponding card pad.

5. The apparatus of claim 2, further comprising a second chip package that has a second chip connection surface with a second array of micro-bumps that comprises a second plurality of subarrays of micro-bumps, wherein the interconnect layer of the interposer electrically connects selected micro-bumps on the chip package to corresponding micro-bumps on the second chip package.

6. The apparatus of claim 1, wherein the laminate circuit card comprises an interface layer at the card connection surface, wherein:
   the interface layer comprises openings that are spaced at the chip pitch,
   each opening corresponds to a micro-bump on the chip connection surface of the chip package, and
   subarrays of the openings correspond to the card pads.

7. The apparatus of claim 6, further comprising a second chip package that has a second chip connection surface with a second array of micro-bumps that comprises a second plurality of subarrays of micro-bumps, wherein the interface layer comprises chip-to-chip connection traces that electrically connect selected micro-bumps on the chip package to corresponding micro-bumps on the second chip package.

8. The apparatus of claim 1, wherein the micro-bumps are arranged in orthogonal subarrays forming the pattern.

9. The apparatus of claim 8, wherein the chip package has a data signal pathway, there are nine positions in each subarray, and at least a central position in a subarray has a micro-bump that is connected to the data signal pathway of the chip package.

10. The apparatus of claim 1, wherein the card pads are arranged in an orthogonal array aligned to the pattern.

11. The apparatus of claim 1, wherein the micro-bumps are arranged in hexagonal subarrays forming the pattern.

12. The apparatus of claim 11, wherein the chip package has a data signal pathway, and wherein there are seven positions in each subarray and at least a central position in a subarray has a micro-bump that is connected to the data signal pathway of the chip package.

13. The apparatus of claim 1, wherein the card pads are arranged in a hexagonal array aligned to the pattern.

14. The apparatus of claim 1, wherein the plurality of subarrays of micro-bumps include a subarray including the cluster of power micro-bumps connected to a chip package power bus of the chip package, a subarray including the cluster ground micro-bumps connected to a chip ground bus of the chip package, and a subarray including the cluster of signal micro-bumps connected to a chip package data signal I/O of the chip package.

15. An apparatus that comprises:
   a chip package that has a chip connection surface and has an array of micro-bumps on the chip connection surface, wherein the array of micro-bumps comprises a plurality of subarrays of micro-bumps, wherein the micro-bumps within each subarray are spaced apart by a chip pitch and the subarrays within the array are spaced apart by a card pitch that is an integer multiple of the chip pitch; and an interposer that is disposed adjacent to the chip connection surface of the chip package, wherein the interposer comprises:

a first surface that is adjacent to the chip connection surface;

an interconnect layer that is adjacent to the first surface and electrically connected to the micro-bumps;

a second surface that is opposite the first surface; and an array of vias that extend from the interconnect layer to the second surface and are arranged in a plurality of subarrays, wherein each subarray of vias is electrically connected by the interconnect layer to a corresponding subarray of micro-bumps, wherein each subarray of vias has fewer vias than a corresponding number of micro-bumps in the corresponding subarray of micro-bumps, and the interconnect layer is arranged to evenly distribute electrical current from each subarray of micro-bumps to the corresponding subarray of vias.

16. The apparatus of claim 15, wherein each subarray of vias has approximately the same total cross-sectional area as the corresponding subarray of micro-bumps.

17. The apparatus of claim 15, wherein the micro-bumps of each subarray are one of power micro-bumps, ground micro-bumps, or signal micro-bumps.

18. The apparatus of claim 15, further comprising a laminate circuit card that has a card connection surface that faces the second surface of the interposer and that has an array of card pads on the card connection surface, wherein the card pads are spaced apart by the card pitch and arranged in a pattern, wherein the subarrays of vias of the interposer are straight through electrical connections between the interconnect layer of the interposer and the subarrays of micro-bumps of the chip package.

19. An apparatus comprising:

a chip package that has a chip connection surface and has an array of micro-bumps on the chip connection surface, wherein the array of micro-bumps comprises a pattern of a plurality of subarrays of micro-bumps, wherein each subarray includes a cluster of power micro-bumps, a cluster of ground micro-bumps, or a cluster of signal micro-bumps, and the array of micro-bumps includes a subarray connected to a chip package power bus, a subarray connected to a chip ground bus, and a subarray connected to a chip package data signal I/O, wherein the micro-bumps within each subarray are spaced apart by a chip pitch and the subarrays within the pattern are spaced apart by a card pitch that is an integer multiple of the chip pitch;

a laminate circuit card that has a card connection surface that faces the chip connection surface of the chip package and that has an array of card pads adjacent to the card connection surface, wherein the card pads are spaced apart by the card pitch; and means for electrically connecting each of the card pads to a corresponding subarray of micro-bumps.

20. The apparatus of claim 19, wherein each of the card pads is aligned to the pattern and electrically connected with all of the micro-bumps of the corresponding subarray of micro-bumps.

21. The apparatus of claim 19, wherein the array of card pads includes at least one power card pad, at least one ground card pad, and a plurality of signal card pads.

22. An apparatus that comprises:

a chip package that has a chip connection surface and has an array of micro-bumps on the chip connection surface, wherein the array of micro-bumps comprises a plurality of subarrays of micro-bumps, wherein the micro-bumps within each subarray are spaced apart by a chip pitch and the subarrays within the array are spaced apart by a card pitch that is an integer multiple of the chip pitch; and an interposer that is disposed adjacent to the chip connection surface of the chip package, wherein the interposer comprises:

a first surface that is adjacent to the chip connection surface;

an interconnect layer that is adjacent to the first surface and electrically connected to the micro-bumps;

a second surface that is opposite the first surface; and an array of vias that extend from the interconnect layer to the second surface and are arranged in a plurality of subarrays, wherein each subarray of vias is electrically connected by the interconnect layer to a corresponding subarray of micro-bumps, wherein each subarray of vias has approximately the same total cross-sectional area as the corresponding subarray of micro-bumps.

\* \* \* \* \*